United States Patent
Zheng (10) Patent No.: US 11,526,232 B2
(45) Date of Patent: Dec. 13, 2022

(54) DISPLAY MODULE AND DISPLAY DEVICE (71) Applicant: WUHAN CHINA STAR OPTOELECTRONICS SEMICONDUCTOR DISPLAY TECHNOLOGY CO., LTD., Hubei (CN)

(72) Inventor: Huidong Zheng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/291,611

(22) PCT Filed: Apr. 12, 2021

(86) PCT No.: PCT/CN2021/086436
§ 371 (c)(1),
(2) Date: May 6, 2021

(65) Prior Publication Data
US 2022/0308728 A1    Sep. 29, 2022

(30) Foreign Application Priority Data

Mar. 26, 2021    (CN) .......................... 202110323472.0

(51) Int. Cl.
G06F 3/041 (2006.01)
H01L 27/32 (2006.01)
G06F 3/044 (2006.01)

(52) U.S. Cl.
CPC ........ *G06F 3/04164* (2019.05); *G06F 3/0443* (2019.05); *G06F 3/0446* (2019.05); *H01L 27/323* (2013.01); *G06F 2203/04111* (2013.01)

(58) Field of Classification Search
CPC .. G06F 3/04164; G06F 3/0443; G06F 3/0446; G06F 2203/04111; H01L 27/323
See application file for complete search history.

(56) References Cited

U.S. PATENT DOCUMENTS

| | | | | |
|---|---|---|---|---|
| 5,859,679 A | * | 1/1999 | Song ...................... | G02F 1/1362 349/55 |
| 8,953,647 B1 | * | 2/2015 | Mead ..................... | H01S 3/1616 372/6 |
| 9,335,596 B2 | * | 5/2016 | Jia .......................... | G02F 1/1368 |
| 11,295,658 B2 | * | 4/2022 | Wang .................... | G09G 3/2074 |
| 2001/0028418 A1 | * | 10/2001 | Ozaki ............... | G02F 1/136286 349/54 |
| 2007/0096768 A1 | * | 5/2007 | Li ......................... | G09G 3/3648 349/54 |

(Continued)

FOREIGN PATENT DOCUMENTS

| | | |
|---|---|---|
| CN | 206331215 U | 7/2017 |
| CN | 206515805 U | 9/2017 |
| KR | 20190030302 A | 3/2019 |

*Primary Examiner* — Amy Onyekaba
(74) *Attorney, Agent, or Firm* — PV IP PC; Wei Te Chung; Ude Lu (57) ABSTRACT

A display module and a display device are provided. The display module includes a plurality of touch electrode sets. Each of the touch electrode sets is connected to one touch signal line. One backup wiring at least corresponds to one of touch signal lines. An orthogonal projection of first ends of the touch signal lines on the display panel partially overlaps an orthogonal projection of a terminal-side bridging section on the display panel. An orthogonal projection of second ends of the touch signal lines on the display panel partially overlaps an orthogonal projection of a wiring-side bridging section on the display panel.

18 Claims, 5 Drawing Sheets

(56) References Cited

U.S. PATENT DOCUMENTS

| | | | |
|---|---|---|---|
| 2007/0206126 A1* | 9/2007 | Lin | G02F 1/136259 349/54 |
| 2008/0158127 A1* | 7/2008 | Chang | G09G 3/3688 345/93 |
| 2009/0115959 A1* | 5/2009 | Lee | G02F 1/136259 349/192 |
| 2010/0007615 A1* | 1/2010 | Wu | G06F 3/047 345/173 |
| 2012/0081300 A1* | 4/2012 | Chan | G06F 3/0446 345/173 |
| 2012/0092306 A1* | 4/2012 | Liu | G09G 3/20 345/204 |
| 2012/0112197 A1* | 5/2012 | Yoshida | G02F 1/13458 257/E29.273 |
| 2012/0147311 A1* | 6/2012 | Chen | G02F 1/136259 349/139 |
| 2012/0168762 A1* | 7/2012 | Kikuchi | G02F 1/13458 257/E29.273 |
| 2014/0168594 A1* | 6/2014 | Deng | G02F 1/136259 349/150 |
| 2015/0054165 A1* | 2/2015 | Won | H01L 27/124 257/773 |
| 2015/0108480 A1* | 4/2015 | Xu | H01L 22/22 438/4 |
| 2016/0170544 A1* | 6/2016 | Wang | G06F 3/04164 345/173 |
| 2016/0187750 A1* | 6/2016 | Tang | G02F 1/136259 257/773 |
| 2017/0185223 A1* | 6/2017 | Lu | G06F 3/04164 |
| 2018/0102396 A1* | 4/2018 | Han | H01L 27/3276 |

\* cited by examiner

DISPLAY MODULE AND DISPLAY DEVICE

BACKGROUND OF INVENTION

Field of Invention

The present disclosure relates to the field of display and particularly to a display module and a display device.

Description of Prior Art

With continuous maturity of organic light emitting diode (OLED) display technology, encapsulated touch integrated structures (direct on-cell touch, DOT) of directly manufacturing touch structures on thin-film encapsulation layers are applied in wide range.

Currently, due to requirements for narrow bezels of current organic light emitting diode (OLED) display panels, line widths of touch signal wirings in DOT structures are increasingly narrower. Structures such as tiny particles existing below the touch signal wirings easily cause lines to be disconnected, resulting in failure in touch functions. Furthermore, this kind of touch signal wiring disconnection problem can only be discovered in module detection, resulting in failure in repair and reducing product yield.

SUMMARY OF INVENTION

One embodiment of the present disclosure provides a display module and a display device to solve the technical problem that disconnection in touch signal wirings of current display module is unable to be repaired.

One embodiment of the present disclosure provides a display module, including a display panel and a touch structure disposed on a side of the display panel. The display panel includes a display region and a non-display region arranged around the display region, and the touch structure includes:

a touch layer, wherein the touch layer includes a plurality of touch electrode sets located in the display region;

a plurality of touch signal lines disposed in the non-display region, wherein each of the touch electrode sets is connected to one of the touch signal lines; and a backup wiring set located in the non-display region and disposed on a different layer from the touch signal lines, wherein the backup wiring set includes at least one backup wiring, and wherein the backup wiring includes a terminal-side bridging section and a wiring-side bridging section, one backup wiring at least corresponds to one of the touch signal lines, an orthogonal projection of first ends of the touch signal lines corresponding to the backup wiring on the display panel partially overlaps an orthogonal projection of the terminal-side bridging section on the display panel, and an orthogonal projection of second ends of the touch signal lines corresponding to the backup wiring on the display panel partially overlaps an orthogonal projection of the wiring-side bridging section on the display panel.

In the display module provided by one embodiment of the present disclosure, the plurality of touch electrode sets include at least two first touch electrode sets and at least two second touch electrode sets. Each of the first touch electrode sets is arranged along a first direction and is located in the display region. Each of the second touch electrode sets is arranged along a second direction and is located in the display region. The second direction intersects with the first direction and is disposed at a predetermined angle with the first direction.

The non-display region includes a touch wiring region located on a peripheral side of the display region and a hub region located on a side of the touch wiring region away from the display region. The terminal-side bridging section and the first ends of the touch signal lines are located in the hub region. The wiring-side bridging section and the second ends of the touch signal lines are located in the touch wiring region.

In the display module provided by one embodiment of the present disclosure, the plurality of touch signal lines include a plurality of first touch signal lines respectively connected to each of the first touch electrode sets, and the at least one of the backup wiring includes a first backup wiring.

The first backup wiring includes a first-terminal-side bridging section and a first-wiring-side bridging section. An orthogonal projection of first ends of the first touch signal lines on the display panel partially overlaps an orthogonal projection of the first-terminal-side bridging section on the display panel, and an orthogonal projection of second ends of the first touch signal lines on the display panel partially overlaps an orthogonal projection of the first-wiring-side bridging section on the display panel.

In the display module provided by one embodiment of the present disclosure, the touch wiring region includes a first touch wiring sub-region located on a first side of the display region. The first touch signal lines are connected to the first touch electrode sets through the second ends of the first touch signal lines. The first-wiring-side bridging section and the second ends of the first touch signal lines are disposed in the first touch signal wiring sub-region.

In the display module provided by one embodiment of the present disclosure, the plurality of touch signal lines include second touch signal lines connected to at least one of the second touch electrode sets. The at least one backup includes a second backup wiring.

The second backup wiring includes a second-terminal-side bridging section and a second-wiring-side bridging section. An orthogonal projection of first ends of the second touch signal lines on the display panel partially overlaps an orthogonal projection of the second-terminal-side bridging section on the display panel. An orthogonal projection of second ends of the second touch signal lines on the display panel partially overlaps an orthogonal projection of the second-wiring-side bridging section on the display panel.

In the display module provided by one embodiment of the present disclosure, the touch wiring region includes a second touch wiring sub-region located on a second side of the display region, and the second touch wiring sub-region is located between the display region and the hub region.

The second touch signal lines are connected to the second touch electrode sets through the second ends of the second touch signal lines. The second-wiring-side bridging section and the second ends of the second touch signal lines are disposed in the second touch wiring sub-region.

In the display module provided by one embodiment of the present disclosure, the plurality of touch signal lines include third touch signal lines connected to at least one of the second touch electrode sets. The at least one backup wiring includes a third backup wiring.

The third backup wiring includes a third-terminal-side bridging section and a third-wiring-side bridging section. An orthogonal projection of first ends of the third touch signal lines on the display panel partially overlaps an orthogonal projection of the third-terminal-side bridging section on the display panel. An orthogonal projection of second ends of the third touch signal lines on the display panel partially overlaps an orthogonal projection of the third-wiring-side bridging section on the display panel.

In the display module provided by one embodiment of the present disclosure, the touch wiring region includes a third touch wiring sub-region located on a third side of the display region. The third touch signal lines are connected to the second touch electrode sets through the second end of the third touch signal lines. The third-wiring-side bridging section and the second end of the third touch signal lines are disposed in the third touch wiring sub-region.

In the display module provided by one embodiment of the present disclosure, the second backup wiring further includes a second main line segment connected to the second-terminal-side bridging section and the second-wiring-side bridging section. The third backup wiring further includes a third main line segment connected to the third-terminal-side bridging section and the third-wiring-side bridging section. The second main line segment at least partially overlaps the third main line segment.

In the display module provided by one embodiment of the present disclosure, an orthogonal projection of the third main line segment on the display panel partially overlaps an orthogonal projection of the third touch signal lines on the display panel.

In the display module provided by one embodiment of the present disclosure, the touch structure includes a first insulation layer and a plurality of bridging blocks. The backup wiring set and the bridging blocks are disposed on a side of the first insulation layer. The first touch electrode sets, the second touch electrode sets, and the touch signal lines are disposed on a side of the first insulation layer away from the backup wiring set.

The first touch electrode sets include at least two first touch electrodes arranged along the second direction and sequentially connected together. The second touch electrode sets include at least two second touch electrodes arranged along the first direction and sequentially connected together. Two adjacent first touch electrodes are bridged by one of the bridging blocks. The backup wiring set and the bridging blocks are structures integrated in one piece.

Correspondingly, one embodiment of the present disclosure further provides a display device. The display device includes a display panel and a touch structure disposed on a side of the display panel. The display panel includes a display region and a non-display region arranged around the display region. The touch structure includes:

a touch layer, wherein the touch layer comprises a plurality of touch electrode sets located in the display region;

a plurality of touch signal lines disposed in the non-display region, wherein each of the touch electrode sets is connected to one of the touch signal lines; and a backup wiring set located in the non-display region and disposed on a different layer from the touch signal lines, wherein the backup wiring set includes at least one backup wiring, and wherein the backup wiring includes a terminal-side bridging section and a wiring-side bridging section, one backup wiring at least corresponds to one of the touch signal lines, an orthogonal projection of first ends of the touch signal lines corresponding to the backup wiring on the display panel partially overlaps an orthogonal projection of the terminal-side bridging section on the display panel, and an orthogonal projection of second ends of the touch signal lines corresponding to the backup wiring on the display panel partially overlaps an orthogonal projection of the wiring-side bridging section on the display panel.

In the display device provided by one embodiment of the present disclosure, the plurality of touch electrode sets include at least two first touch electrode sets and at least two second touch electrode sets. Each of the first touch electrode sets is arranged along a first direction and is located in the display region. Each of the second touch electrode sets is arranged along a second direction and is located in the display region. The second direction intersects with the first direction and is disposed at a predetermined angle with the first direction.

The non-display region includes a touch wiring region located on a peripheral side of the display region and a hub region located on a side of the touch wiring region away from the display region. The terminal-side bridging section and the first ends of the touch signal lines are located in the hub region. The wiring-side bridging section and the second ends of the touch signal lines are located in the touch wiring region.

In the display device provided by one embodiment of the present disclosure, the plurality of touch signal lines include a plurality of first touch signal lines respectively connected to each of the first touch electrode sets, and the at least one of the backup wiring includes a first backup wiring.

The first backup wiring includes a first-terminal-side bridging section and a first-wiring-side bridging section. An orthogonal projection of first ends of the first touch signal lines on the display panel partially overlaps an orthogonal projection of the first-terminal-side bridging section on the display panel, and an orthogonal projection of second ends of the first touch signal lines on the display panel partially overlaps an orthogonal projection of the first-wiring-side bridging section on the display panel.

In the display device provided by one embodiment of the present disclosure, the touch wiring region includes a first touch wiring sub-region located on a first side of the display region. The first touch signal lines are connected to the first touch electrode sets through the second ends of the first touch signal lines. The first-wiring-side bridging section and the second ends of the first touch signal lines are disposed in the first touch signal wiring sub-region.

In the display device provided by one embodiment of the present disclosure, the plurality of touch signal lines include second touch signal lines connected to at least one of the second touch electrode sets. The at least one backup includes a second backup wiring.

The second backup wiring includes a second-terminal-side bridging section and a second-wiring-side bridging section. An orthogonal projection of first ends of the second touch signal lines on the display panel partially overlaps an orthogonal projection of the second-terminal-side bridging section on the display panel. An orthogonal projection of second ends of the second touch signal lines on the display panel partially overlaps an orthogonal projection of the second-wiring-side bridging section on the display panel.

In the display device provided by one embodiment of the present disclosure, the touch wiring region includes a second touch wiring sub-region located on a second side of the display region, and the second touch wiring sub-region is located between the display region and the hub region.

The second touch signal lines are connected to the second touch electrode sets through the second ends of the second touch signal lines. The second-wiring-side bridging section and the second ends of the second touch signal lines are disposed in the second touch wiring sub-region.

In the display device provided by one embodiment of the present disclosure, the plurality of touch signal lines include third touch signal lines connected to at least one of the second touch electrode sets. The at least one backup wiring includes a third backup wiring.

The third backup wiring includes a third-terminal-side bridging section and a third-wiring-side bridging section. An orthogonal projection of first ends of the third touch signal lines on the display panel partially overlaps an orthogonal projection of the third-terminal-side bridging section on the display panel. An orthogonal projection of second ends of the third touch signal lines on the display panel partially overlaps an orthogonal projection of the third-wiring-side bridging section on the display panel.

In the display device provided by one embodiment of the present disclosure, the touch wiring region includes a third touch wiring sub-region located on a third side of the display region. The third touch signal lines are connected to the second touch electrode sets through the second end of the third touch signal lines. The third-wiring-side bridging section and the second end of the third touch signal lines are disposed in the third touch wiring sub-region.

In the display device provided by one embodiment of the present disclosure, the second backup wiring further includes a second main line segment connected to the second-terminal-side bridging section and the second-wiring-side bridging section. The third backup wiring further includes a third main line segment connected to the third-terminal-side bridging section and the third-wiring-side bridging section. The second main line segment at least partially overlaps the third main line segment.

Beneficial effects of the present disclosure: In the embodiments of the present disclosure, the backup wiring in the backup wiring set and the touch signal lines are disposed in different layers; the backup wiring includes the terminal-side bridging section and the wiring-side bridging section; one of the backup wirings at least corresponds to one of the touch signal lines to allow the orthogonal projection of the first ends of the touch signal lines corresponding to the backup wiring on the display panel to partially overlap the orthogonal projection of the terminal-side bridging section on the display panel, and the orthogonal projection of the second ends of the touch signal lines corresponding to the backup wiring on the display panel partially overlapping with the orthogonal projection of the wiring-side bridging section on the display panel is allowed at the same time. Therefore, when the touch signal lines are disconnected in module detection, it is conducive to using a method such as a laser beam welding method at a position of the two ends of the touch signal lines overlapping the projections of the terminal-side bridging section and the wiring-side bridging section respectively to repair the disconnected touch signal lines, and the problem of low product yield incurred by inability to repair is prevented.

DESCRIPTION OF DRAWINGS

In order to more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which those skilled in the art can derive further figures without making any inventive efforts.

DETAILED DESCRIPTION OF EMBODIMENTS

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are just refer to directions of the accompanying figures. Therefore, the used directional terms are for illustrating and understanding the present disclosure, but not for limiting the present disclosure. In the figures, units with similar structures are used same labels to indicate.

In description of the present disclosure, it should be understood that the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the description of the present disclosure, unless specified or limited otherwise, terms "mounted," "connected," "coupled," and the like are used in a broad sense, and may include, for example, fixed connections, detachable connections, or integral connections; may also be mechanical or electrical connections or may be communication between each other; may also be direct connections or indirect connections via intervening structures; may also be inner communications of two elements or may be a relationship of interaction between two elements. For persons skilled in the art in this field, the specific meanings of the above terms in the present disclosure can be understood with specific cases.

Hereinafter, the technical solution of the present disclosure is described with reference to specific embodiments.

One embodiment of the present disclosure provides a display module and a display device. The details are described below respectively. It should be noted that a description order of the following embodiments is not intended to limit a preferred order of the embodiments.

Please refer to FIG. 1 to FIG. 4. One embodiment of the present disclosure provides a display module, including a display panel 1 and a touch structure 2 disposed on a side of the display panel. The display panel 1 includes a display region 100 and a non-display region 200 arranged around the display region. The touch structure 2 includes:

a touch layer, wherein the touch layer includes a plurality of touch electrode sets located in the display region 100; a plurality of touch electrode sets including at least two first touch electrode sets 11 and at least two second touch electrode sets 12, wherein each of the first touch electrode sets 11 is arranged along a first direction 300 and is located in the display region 100, each of the second touch electrode sets 12 is arranged along a second direction 400 and is located in the display region 100, and the second direction 400 intersects with the first direction 300 and is disposed at a predetermined angle with the first direction 300;

a plurality of touch signal lines disposed in the non-display region 200, wherein each of the touch electrode sets is connected to one of the touch signal lines; and a backup wiring set located in the non-display region 200 and disposed on a different layer from the touch signal lines, wherein the backup wiring set includes at least one backup wiring, and wherein the backup wiring includes a terminal-side bridging section and a wiring-side bridging section, one backup wiring at least corresponds to one of the touch signal lines, an orthogonal projection of first ends of the touch signal lines corresponding to the backup wiring on the display panel 1 partially overlaps an orthogonal projection of the terminal-side bridging section on the display panel 1, and an orthogonal projection of second ends of the touch signal lines corresponding to the backup wiring on the display panel 1 partially overlaps an orthogonal projection of the wiring-side bridging section on the display panel 1.

In one embodiment, due to requirements for narrow bezels of current organic light emitting diode (OLED) display panels, line widths of touch signal wirings in direct on-cell touch (DOT) structures are increasingly narrower. Structures such as tiny particles existing below the touch signal wirings easily cause lines to be disconnected, resulting in failure in touch functions. Furthermore, this kind of touch signal wiring disconnection problem can only be discovered when the modules are tested, resulting in inability of repair and reducing product yield.

In this embodiment, by disposing the backup wiring set, the backup wiring in the backup wiring set and the touch signal lines are disposed in different layers; the backup wiring includes the terminal-side bridging section and the wiring-side bridging section; one of the backup wirings at least corresponds to one of the touch signal lines to allow the orthogonal projection of the first ends of the touch signal lines corresponding to the backup wiring on the display panel 1 to partially overlap the orthogonal projection of the terminal-side bridging section on the display panel 1, and at the same time, the orthogonal projection of the second ends of the touch signal lines corresponding to the backup wiring on the display panel partially is allowed to overlap the orthogonal projection of the wiring-side bridging section on the display panel. Therefore, when the touch signal lines are disconnected in module detection, it is conducive to using a method such as a laser beam welding method at a position of the two ends of the touch signal lines overlapping the projections of the terminal-side bridging section and the wiring-side bridging section respectively to repair the disconnected touch signal lines, and the problem of low product yield incurred by inability to repair is prevented.

Continuing the above, the terminal-side bridging section can be connected to the first ends of the touch signal lines by a method of laser beam welding, the wiring-side bridging section can also be connected to the second ends of the touch signal lines by the method of laser beam welding, and disposed positions of the terminal-side bridging section and the wiring-side bridging section can be connected to the two ends of the touch signal lines respectively. Therefore, repair after the touch signal lines are disconnected at different positions can be realized well.

It can be understood that the display panel 1 and the touch structure 2 in the display module can be manufactured respectively and then combined together, or they can also be an encapsulated touch integrated structure. In this embodiment, the display panel 1 and the touch structure 2 are the encapsulated touch integrated structure. Specifically, the display panel 1 can include an array substrate, an organic light emitting functional layer, and an encapsulation layer. The touch structure 2 can be disposed on the encapsulation layer. In addition, the touch layer includes the at least two first touch electrode sets 11 and the at least two second touch electrode sets 12. Each of the first touch electrode sets 11 is arranged along the first direction 300, and each of the second touch electrode sets 12 is arranged along the second direction 400 and is located in the display region 100. The second direction 400 intersects with the first direction 300 and is disposed at the predetermined angle with the first direction 300. Wherein, the first touch electrode sets 11 include at least two first touch electrodes 111 arranged along the second direction 400 and sequentially connected together, and the second touch electrode sets 12 include at least two second touch electrodes 121 arranged along the first direction 300 and sequentially connected together. Wherein, the first touch electrodes 111 can be touch sensing electrodes (Rx), and the second touch electrodes 121 can be touch driving electrodes (Tx). Specifically, the first direction 300 is perpendicular to the second direction 400.

In one embodiment, please refer to FIG. 2, FIG. 3, FIG. 4, and FIG. 7. The touch structure 2 includes a first insulation layer 40 and a plurality of bridging blocks 1111. The backup wiring set and the bridging blocks 1111 are disposed on a side of the first insulation layer 40. The first touch electrode sets 11, the second touch electrode sets 12, and the touch signal lines are disposed on a side of the first insulation layer 40 away from the backup wiring set. Two adjacent first touch electrodes 111 are bridged by one of the bridging blocks 1111. Specifically, a plurality of via holes can be defined on the first insulation layer 40, and the two adjacent first touch electrodes 111 and the bridging blocks 1111 can be bridged through the via holes. The backup wiring set and the bridging blocks are a structure integrated into one piece. Obviously, by integrating the backup wiring set and the bridging blocks 1111 in one piece in a same manufacturing process, under a condition of adding the backup wiring set for implementation of facilitating inspection and repair of the touch signal lines, not needing to add steps of manufacturing processes of the touch structure 2 is allowable.

Wherein, please refer to FIG. 5 to FIG. 9. The touch structure 2 can further include a second insulation layer 50 disposed on the encapsulation layer. The plurality of bridging blocks 1111 and the backup wiring set can be disposed on the second insulation layer 50. The first insulation layer 40 is disposed on the second insulation layer 50, the bridging blocks 1111, and the backup wiring and covers the bridging blocks 1111 and the backup wiring. The first touch electrode sets 11 and the second touch electrode set 12 are disposed on the first insulation layer 40. A third insulation layer 60 covering the first touch electrode sets 11 and the second touch electrode sets 12 are disposed on the first touch electrode sets 11, the second touch electrode sets 12, and the first insulation layer 40.

Figure 1:
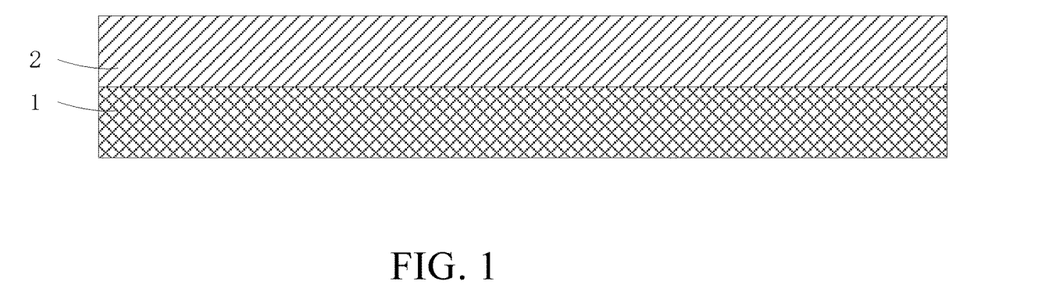
FIG. 1 is structural schematic diagram of a display module provided by one embodiment of the present disclosure.
Figure 2:
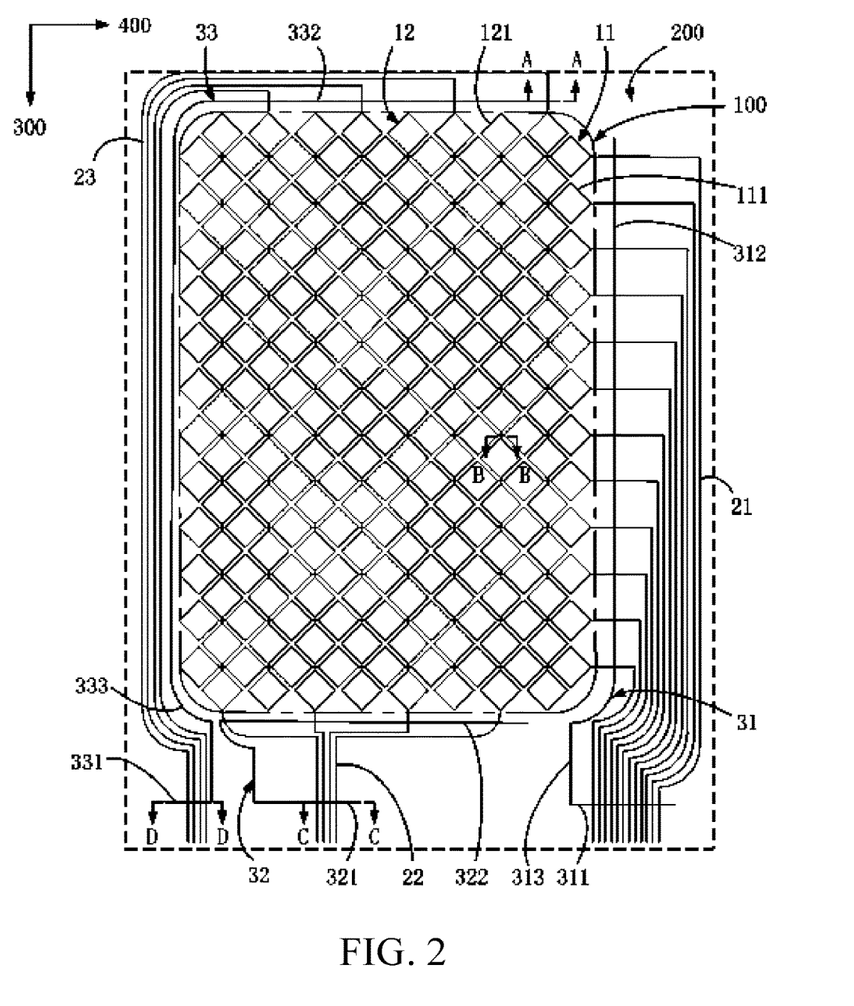
FIG. 2 is a top view of the display module provided by one embodiment of the present disclosure.
Figure 3:
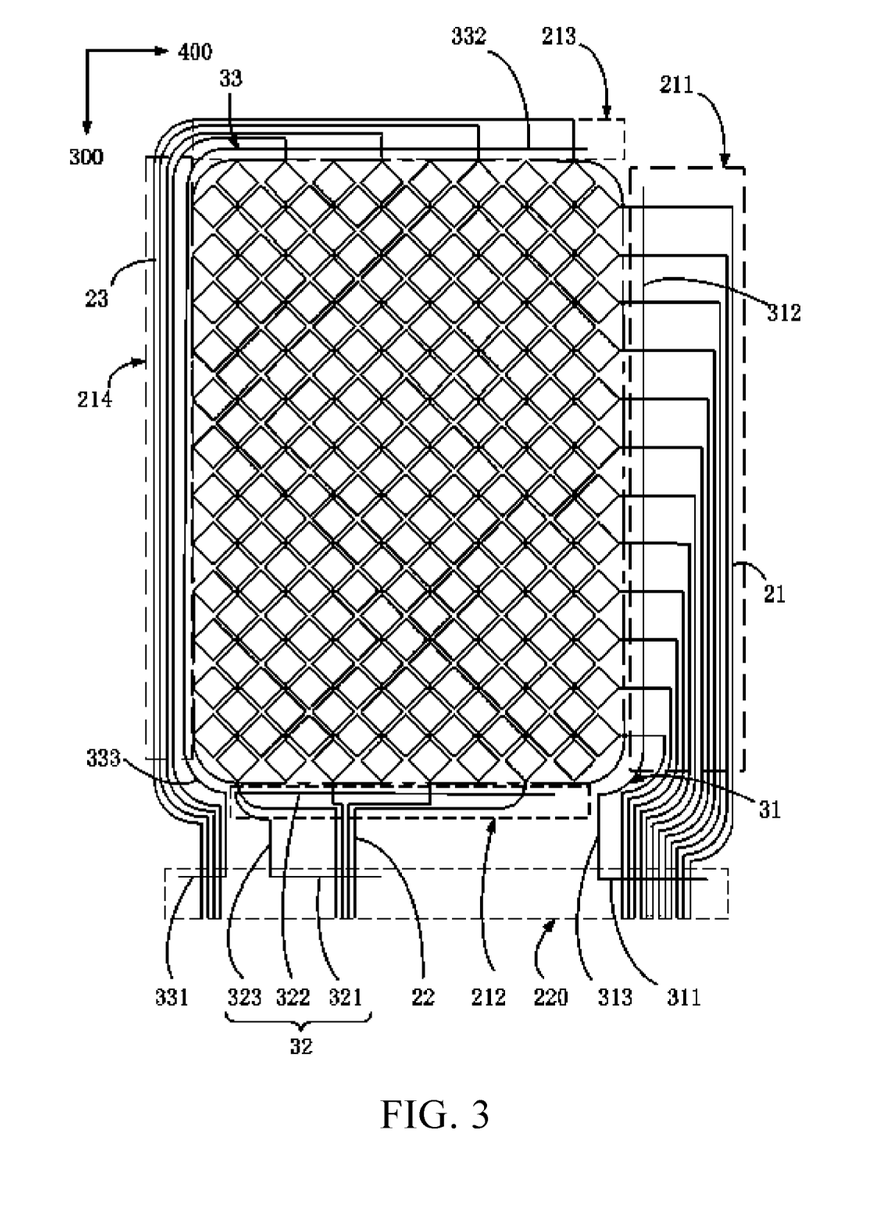
FIG. 3 is a structural schematic diagram of a regional division of a non-display region in FIG. 2.

In one embodiment, please refer to FIG. 2 to FIG. 3. The non-display region 200 includes a touch wiring region 210 located on a peripheral side of the display region 100 and a hub region 220 located on a side of the touch wiring region away from the display region 100. The terminal-side bridging section and the first ends of the touch signal lines are located in the hub region 220. The wiring-side bridging section and the second ends of the touch signal lines are located in the touch wiring region.

It can be understood that each of the touch signal lines can form connection terminals connected to control units such as a flexible printed circuit (FPC) at the hub region 220. The terminal-side bridging section and the first ends of the touch signal lines are located in the hub region 220, which is conducive to realizing wirings of the terminal-side bridging section and the first ends of the corresponding touch signal lines. Specifically, an extending direction of the terminal-side bridging section can be perpendicular to an extending direction of the first ends of the touch signal lines, which is conducive to part of projections of the terminal-side bridging section and the first end of the plurality of touch signal lines overlapping each other in a top view. Similarly, the wiring-side bridging section and the second ends of the touch signal lines are located in the touch signal lines, which is conducive to part of projections of the wiring-side bridging section in the extending direction and the second ends of the plurality of touch signal lines overlapping each other. Therefore, one of the backup wirings being able to correspondingly repair different touch signal lines is realized, and applicability of the backup wirings is improved.

In one embodiment, please refer to FIG. 1 to FIG. 4. The plurality of touch signal lines include a plurality of first touch signal lines 21 respectively connected to each of the first touch electrode sets 11, and the at least one of the backup wiring includes a first backup wiring 31.

The first backup wiring 31 includes a first terminal-side bridging section 311 and a first wiring-side bridging section 312. An orthogonal projection of first ends of the first touch signal lines 21 on the display panel 1 partially overlaps an orthogonal projection of the first-terminal-side bridging section 311 on the display panel 1. An orthogonal projection of second ends of the first touch signal lines 21 on the display panel 1 partially overlaps an orthogonal projection of the first-wiring-side bridging section 312 on the display panel 1. Wherein, the first end of the first touch signal line 21 is an end of the first touch signal lines 21 away from the first touch electrode sets 11, and the second ends of the first touch signal lines 21 is an end of the first touch signal lines 21 close to the first touch electrode sets 11.

In this embodiment, the first touch electrodes 111 can be the touch sensing electrodes (Rx); the first touch signal lines 21 can be configured to transmit touch sensing signals; the first backup wirings 31 can be configured to repair the first touch signal lines 21; the first ends of the first touch signal lines 21 can extend along the first direction 300, and the first-terminal-side bridging section 311 can extend along the second direction 400, which is conducive to the first-terminal-side bridging section 311 and the first end of each of the first touch signal lines 21 arranged in an staggered manner in top view; and the second ends of the first touch signal lines 21 can extend along the second direction 400, and the first-wiring-side bridging section 312 can extend along the first direction 300, which is conducive to the first-wiring-side bridging section 312 and the second end of each of the first touch signal lines 21 arranged in an staggered manner in top view; and the first backup wiring 31 is allowed to repair any of the first touch signal lines 21.

In one embodiment, please refer to FIG. 1 to FIG. 4. The touch wiring region includes a first touch wiring sub-region 211 located on a first side of the display region 100. The first touch signal lines are connected to the first touch electrode sets 11 through the second ends of the first touch signal lines 21. The first-wiring-side bridging section 312 and the second ends of the first touch signal lines 21 are disposed in the first touch wiring sub-region 211. Obviously, because each of the first touch signal lines 21 extends from the first ends of the first touch signal lines 21 located in the hub region 220 to the second ends of the first touch signal lines 21 in the first touch wiring sub-region 211, repair from the first backup wiring 31 for disconnection at any position between the two ends of the first touch signal lines 21 can be realized.

Continuing the above, the first backup wiring 31 further includes a first main line segment 313 connected to the first-terminal-side bridging section 311 and the first-wiring-side bridging section 312. The first main line segment 313 is located between each of the first touch signal lines 21 and the display region 100. Specifically, a number of the first backup wiring 31 is 1. Therefore, influence of disposing the first backup wiring 31 on a narrow bezel of the display panel 1 can be reduced.

In one embodiment, please refer to FIG. 2, FIG. 3, FIG. 4, and FIG. 8. The plurality of the touch signal lines include second touch signal lines 22 connected to at least one of the second touch electrode sets 12. The at least one of the backup wirings includes a second backup wiring 32.

The second backup wiring 32 includes a second-terminal-side bridging section 321 and a second wiring-side bridging section 322. An orthogonal projection of first ends of the second touch signal lines 22 on the display panel partially overlaps an orthogonal projection of the second-terminal-side bridging section 321 on the display panel 1. An orthogonal projection of second ends of the second touch signal lines 22 on the display panel 1 partially overlaps an orthogonal projection of the second-wiring-side bridging section 322 on the display panel 1. Wherein, the first end of the second touch signal line 22 is an end of the second touch signal lines 22 away from the second touch electrode sets 12, and the second ends of the second touch signal lines 22 is an end of the second touch signal lines 22 close to the second touch electrode sets 12.

In this embodiment, the second touch electrodes 121 can be the touch driving electrodes (Tx); the second touch signal lines 22 can be configured to transmit touch driving signals; the second backup wirings 32 can be configured to repair the second touch signal lines 22; first ends of the second touch signal lines 22 and second ends of the second touch signal lines 22 can extend along the first direction 300; and the second-terminal-side bridging section 321 and the second wiring-side bridging section 322 can extend along the second direction 400, which is conducive to arranging the second-terminal-side bridging section 321 and the first end of each second touch signal line 22 in a staggered manner in top view, and is also conducive to arranging the second wiring-side bridging section 322 and the second end of each second touch signal line 22 in a staggered manner in top view. Therefore, the second backup wiring 32 being able to repair any of the second touch signal lines 22 is allowed.

In one embodiment, please refer to FIG. 2, FIG. 3, FIG. 4, and FIG. 8. The touch wiring region includes a second touch wiring sub-region 212 located on a second side of the display region 100, and the second touch wiring sub-region 212 is located between the display region 100 and the hub region 220.

The second touch signal lines 22 are connected to the second touch electrode sets 12 through the second ends of the second touch signal lines 12. The second-wiring-side bridging section 322 and the second ends of the second touch signal lines 22 are disposed in the second touch wiring sub-region 212.

Obviously, because each of the second touch signal lines 22 extends from the first ends of the second touch signal lines 22 located in the hub region 220 to the second ends of the second touch signal lines 22 in the first touch wiring sub-region 212, repair from the second backup wiring 32 for disconnection at any position between the two ends of the second touch signal lines 22 can be realized. In addition, the second touch wiring sub-region 212 is located between the display region 100 and the hub region 220, i.e., the second touch wiring sub-region 212 is located on a side of the display region 100 close to the hub region 220. Therefore, lengths of the second touch wirings and the second backup wiring 32 are reduced. Furthermore, the second touch wiring and the second backup wiring 32 are allowed to not affect the width of the bezel of the display module.

In one embodiment, please refer to FIG. 2, FIG. 3, FIG. 4, and FIG. 9. The plurality of touch signal lines include third touch signal lines 23 connected to at least one of the second touch electrode sets 12. The at least one backup wiring includes a third backup wiring 33.

The third backup wiring 33 includes a third terminal-side bridging section 331 and a third wiring-side bridging section 332. An orthogonal projection of first ends of the third touch signal lines 23 on the display panel 1 partially overlaps an orthogonal projection of the third-terminal-side bridging section 331 on the display panel 1. An orthogonal projection of second ends of the third touch signal lines 23 on the display panel 1 partially overlaps an orthogonal projection of the third-wiring-side bridging section 332 on the display panel 1. Wherein, the first end of the third touch signal line 23 is an end of the third touch signal lines 23 away from the second touch electrode sets 12, and the second end of the third touch signal line 23 is an end of the third touch signal lines 23 close to the second touch electrode sets 12.

Wherein, the second touch electrodes 121 can be the touch driving electrodes (Tx); the third touch signal lines 23 can be configured to transmit touch driving signals; the third backup wirings 33 can be configured to repair the second touch signal lines 22; first ends of the third touch signal lines 23 and second ends of the third touch signal lines 23 can extend along the first direction 300; and the third terminal-side bridging section 331 and the third wiring-side bridging section 332 can extend along the second direction 400, which is conducive to arranging the third terminal-side bridging section 331 and the first end of each third touch signal line 23 in a staggered manner in top view, and is also conducive to arranging the third wiring-side bridging section 332 and the second end of each third touch signal line 23 in a staggered manner in top view. Therefore, the third backup wiring 33 is allowed to be able to repair any of the third touch signal lines 23.

Figure 5:
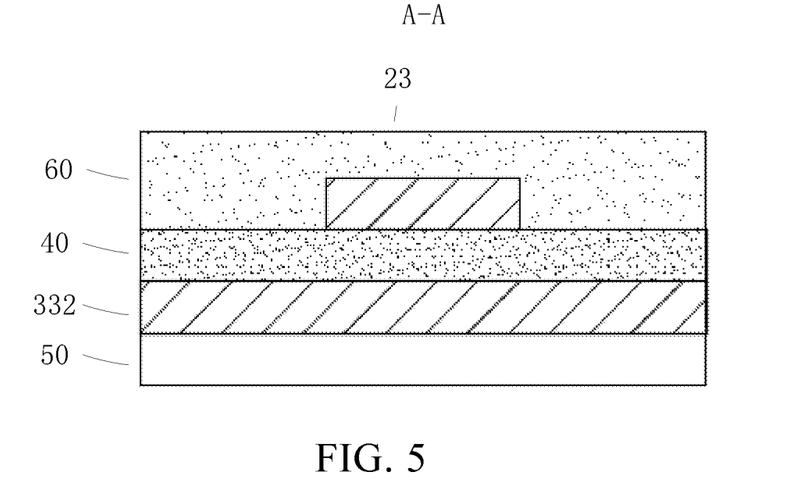
FIG. 5 is a structural schematic diagram of a cross section at position A-A in FIG. 2.
Figure 6:
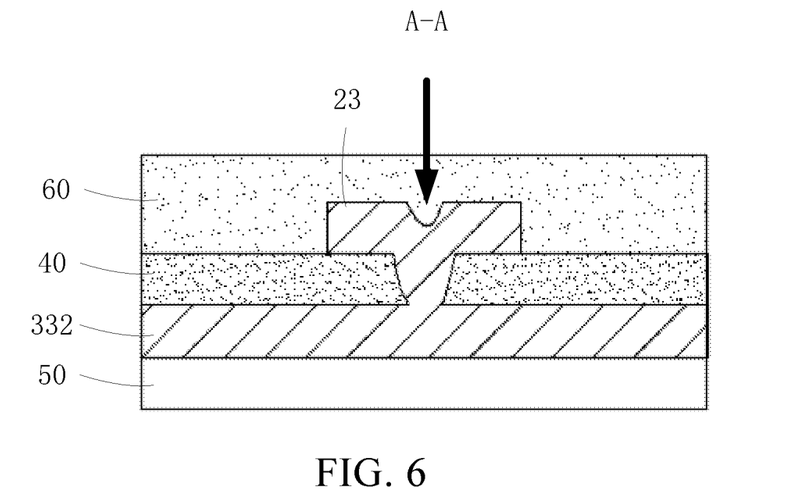
FIG. 6 is a structural schematic diagram of the cross section using laser welding at the position A-A in FIG. 2.
Figure 7:
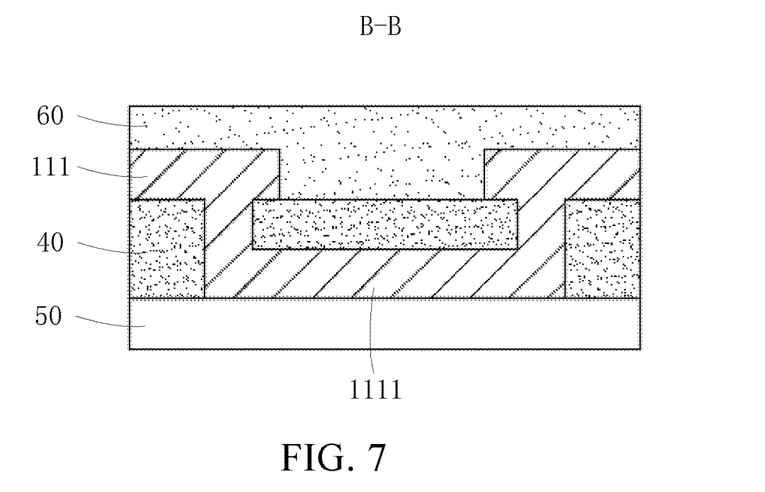
FIG. 7 is a structural schematic diagram of a cross section at position B-B in FIG. 2.
Figure 8:
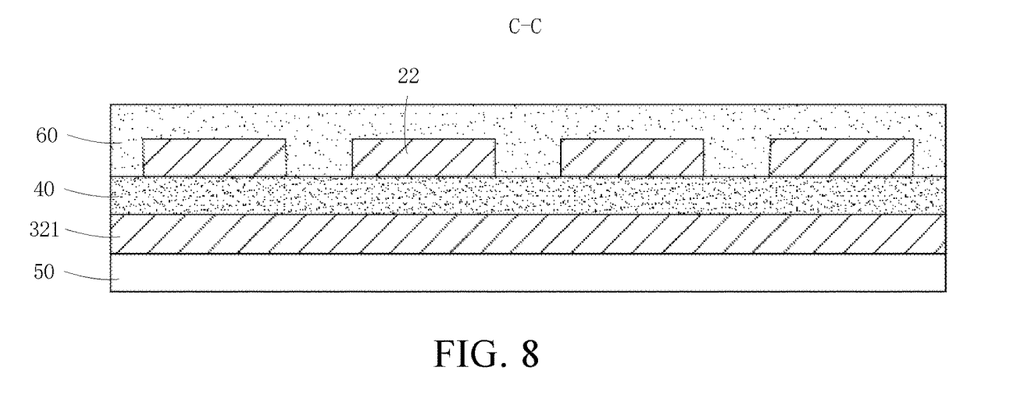
FIG. 8 is a structural schematic diagram of a cross section at position C-C in FIG. 2.
Figure 9:
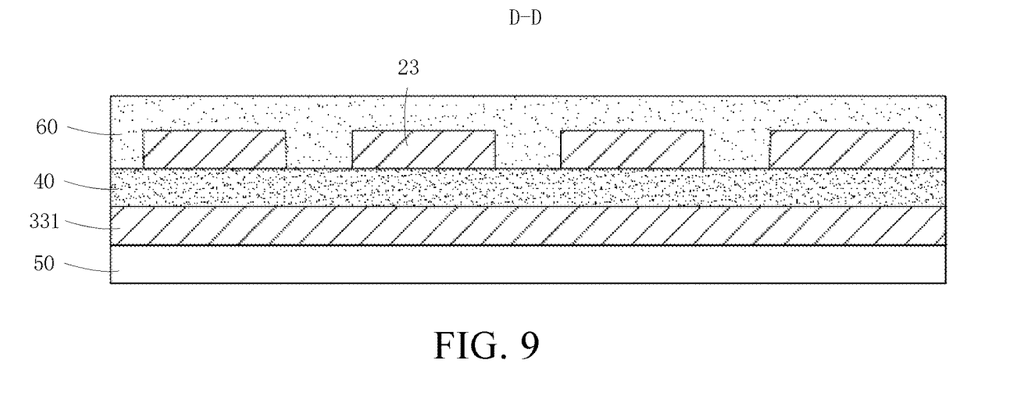
FIG. 9 is a structural schematic diagram of a cross section at position D-D in FIG. 2.

Specifically, please refer to FIG. 2, FIG. 5, and FIG. 6. FIG. 5 is a structural schematic diagram of a cross section at position A-A in FIG. 2. As illustrated in FIG. 5, the third touch signal lines 23 on two sides of the first insulation layer 40 partially overlap the third wiring-side bridging section 332 at a position A-A in top view, that is, the orthogonal projection of the second ends of the third touch signal lines 23 on the display panel 1 partially overlaps an orthogonal projection of the third-wiring-side bridging section 332 on the display panel 1. As mentioned above, when the third touch signal line 23 at the position A-A needs to be repaired, the third touch signal line 23 and the third wiring-side bridging section 332 can be welded by the method of laser beam welding.

The specific is illustrated in FIG. 6. FIG. 6 is a structural schematic diagram of the cross section using laser welding at the position A-A in FIG. 2.

A position indicated by the arrow in FIG. 6 is the position of laser welding. Using a modular laser repair machine at the position A-A in FIG. 2 allows the third touch signal line 23 and the third line-side bridge section 332 to be in connection and to be conductive. In addition, at the position A-A corresponding to the third touch signal line 23 in FIG. 2, the first end of the third touch signal line 23 is further welded to the third terminal-side bridging section 331, and redundant description will not be mentioned herein again.

In one embodiment, please refer to FIG. 2, FIG. 3, FIG. 4, and FIG. 9. The touch wiring region includes a third touch wiring sub-region 213 located on a third side of the display region 100. The third touch signal lines 23 are connected to the second touch electrode sets 12 through the second ends of the third touch signal lines 23. The third-wiring-side bridging section 332 and the second end of the third touch signal lines 23 are disposed in the third touch wiring sub-region 213.

Obviously, because each of the third touch signal lines 23 extends from the first ends of the third touch signal lines 23 located in the hub region 220 to the second ends of the third touch signal lines 23 in the third touch signal wiring sub-region 213, repair from the third backup wiring 33 for disconnection at any position between the two ends of the third touch signal lines 23 can be realized.

In this embodiment, the third touch wiring sub-region 213 and the second touch wiring sub-region 212 are located on two opposite sides of the display region 100. Specifically, the touch layer can include the plurality of second touch electrode sets 12; each of the second touch electrode sets 12 is arranged in parallel in a plurality of rows along the second direction 400; each of the second touch wirings can be respectively connected to the second touch electrode sets 12 in odd-numbered columns; and each of the third touch wirings can be respectively connected to the second touch electrode sets 12 in even-numbered columns. Therefore, an arrangement density of the second end of each second touch wiring and the second end of each third touch wiring can be reduced, which is conducive to the second wiring-side bridging section 322 being welded to the second end of the second touch wiring, and is also conducive to the third wiring-side bridging section 332 being welded to the second end of the third touch wiring.

Figure 4:
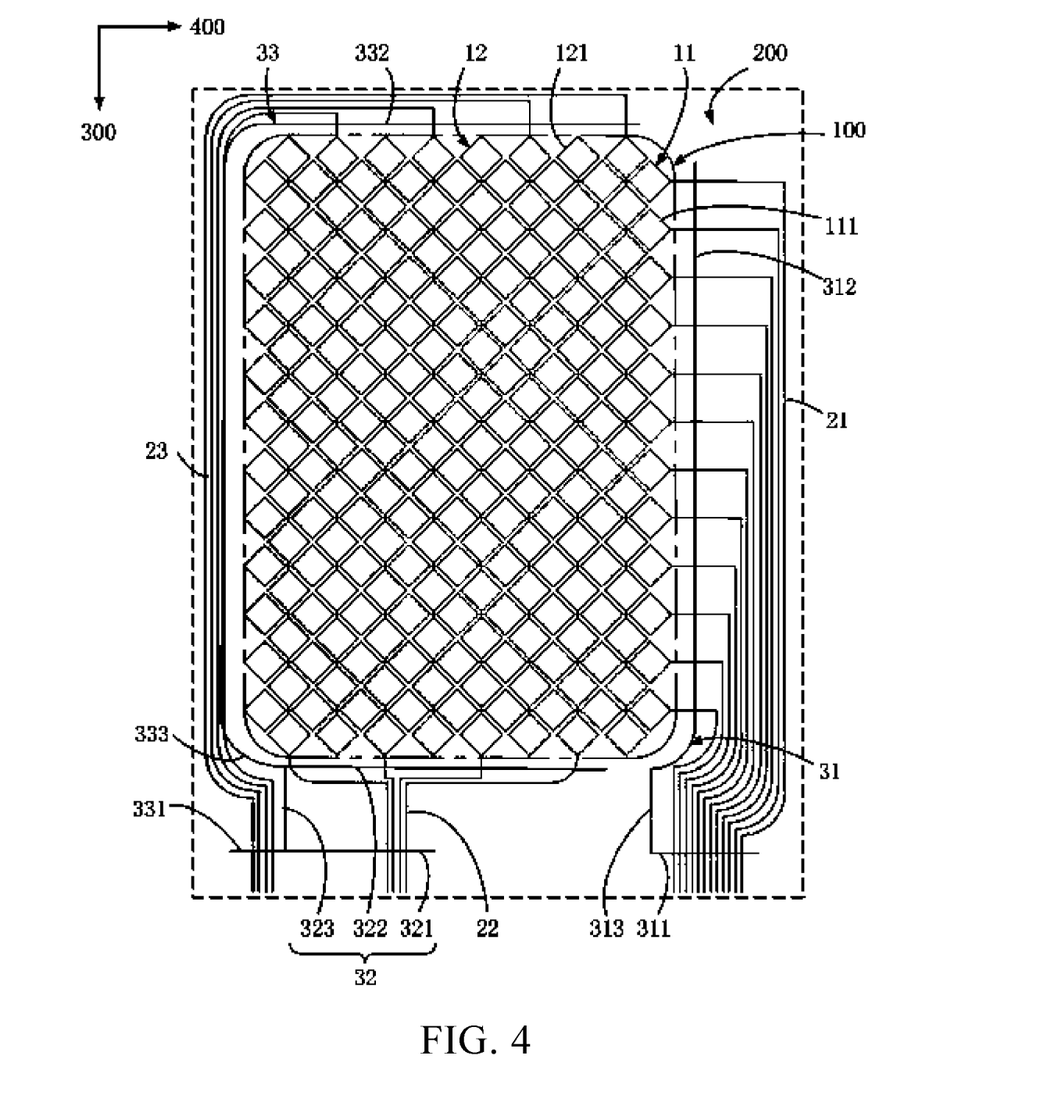
FIG. 4 is another top view of the display module provided by one embodiment of the present disclosure.

In one embodiment, please refer to FIG. 2 to FIG. 4. The second backup wiring 32 further includes a second main line segment 323 connected to the second-terminal-side bridging section 321 and the second-wiring-side bridging section 322. The third backup wiring 33 further includes a third main line segment 333 connected to the third-terminal-side bridging section 331 and the third-wiring-side bridging section 332. The second main line segment 323 at least partially overlaps the third main line segment 333.

Obviously, the second main line segment 323 at least partially overlaps the third main line segment 333, i.e., the second main line segment 323 shares at least part of the lines with the third main line segment. Specifically, the third main line segment 333 can include a common wiring section overlapping the second main line segment 323, and the second-terminal-side bridging section 321 and the second wiring-side bridging section 322 are respectively connected to two ends of the common wiring section. It can be understood that in actual module detection and a repair process, a probability that the second touch wiring and the third touch wiring configured to transmit the touch driving signals are disconnected at the same time is little. Therefore, a structure that the second main line segment 323 at least partially overlaps the third main line segment 333 is adopted, and multiplexing during touch wirings being repaired by the backup wiring set in different positions is realized.

In one embodiment, please refer to FIG. 2 to FIG. 4. An orthogonal projection of the third main line segment 333 on the display panel 1 overlaps an orthogonal projection of the touch signal line 23 on the display panel 1. Obviously, the touch wiring region includes the fourth touch signal wiring sub-region 214 located on a fourth end of the display region 100; the fourth touch signal wiring sub-region 214 and the first touch wiring sub-region 211 are located on two opposite sides of the display region 100; and the third main line segment 333 needs the fourth touch signal wiring sub-region 214 to make the third terminal-side bridging section 331 connect to the third wiring-side bridging section 332. By making the orthogonal projection of the third main line segment 333 on the display panel 1 overlap the orthogonal projection of the third touch signal line 23 on the display panel 1, the third main line segment 333 is allowed to be located below each of the third touch signal lines 23, preventing arrangement of the third main line segment 333 from increasing a width of a bezel of the display module.

One embodiment of the present disclosure further provides a display device. The display device includes the display module of the aforesaid embodiments.

By disposing the backup wiring set in the present disclosure, the backup wiring in the backup wiring set and the touch signal lines are disposed in different layers; furthermore, the backup wiring includes the terminal-side bridging section and a wiring-side bridging section; one backup wiring at least corresponds to one of the touch signal lines; an orthogonal projection of first ends of the touch signal lines corresponding to the backup wiring on the display panel 1 is made to partially overlap an orthogonal projection of the terminal-side bridging section on the display panel 1, and at the same time, an orthogonal projection of second ends of the touch signal lines corresponding to the backup wiring on the display panel 1 is made to partially overlap an orthogonal projection of the wiring-side bridging section on the display panel 1. Therefore, when the touch signal lines are disconnected in module detection, it is conducive to using a method such as laser beam welding at a position of the two ends of the touch signal lines overlapping with the projections of the terminal-side bridging section and the wiring-side bridging section respectively to repair the disconnected touch signal lines, and the problem of low product yield incurred by inability to repair is prevented.

In summary, although the present disclosure has disclosed the preferred embodiments as above, however the above-mentioned preferred embodiments are not to limit to the present disclosure. A person skilled in the art can make any change and modification, therefore the scope of protection of the present disclosure is subject to the scope defined by the claims.

What is claimed is:

1. A display module, comprising a display panel and a touch structure disposed on a side of the display panel, wherein the display panel comprises a display region and a non-display region arranged around the display region, and the non-display region comprises a touch wiring region located on a peripheral side of the display region and a hub region located on a side of the touch wiring region away from the display region;

wherein the touch structure comprises:
a touch layer, wherein the touch layer comprises a plurality of touch electrode sets located in the display region, the plurality of touch electrode sets comprise at least two first touch electrode sets and at least two second touch electrode sets, each of the first touch electrode sets is arranged along a first direction and is located in the display region, each of the second touch electrode sets is arranged along a second direction and is located in the display region, and the second direction intersects with the first direction and is at a predetermined angle with the first direction;
a plurality of touch signal lines disposed in the non-display region, wherein each of the touch electrode sets is connected to one of the touch signal lines; and
a backup wiring set located in the non-display region and disposed on a different layer from the touch signal lines, wherein the backup wiring set comprises at least one backup wiring, and
wherein the backup wiring comprises a terminal-side bridging section and a wiring-side bridging section, one backup wiring at least corresponds to one of the touch signal lines, an orthogonal projection of first ends of the touch signal lines corresponding to the backup wiring on the display panel partially overlaps an orthogonal projection of the terminal-side bridging section on the display panel, an orthogonal projection of second ends of the touch signal lines corresponding to the backup wiring on the display panel partially overlaps an orthogonal projection of the wiring-side bridging section on the display panel, and the terminal-side bridging section and the first ends of the touch signal lines are located in the hub region, and the wiring-side bridging section and the second ends of the touch signal lines are located in the touch wiring region.

2. The display module as claimed in claim 1, wherein the plurality of touch signal lines comprise a plurality of first touch signal lines respectively connected to each of the first touch electrode sets, and the at least one backup wiring comprises a first backup wiring; and
the first backup wiring comprises a first terminal-side bridging section and a first wiring-side bridging section, an orthogonal projection of first ends of the first touch signal lines on the display panel partially overlaps an orthogonal projection of the first-terminal-side bridging section on the display panel, and an orthogonal projection of second ends of the first touch signal lines on the display panel partially overlaps an orthogonal projection of the first-wiring-side bridging section on the display panel.

3. The display module as claimed in claim 2, wherein the touch wiring region comprises a first touch wiring sub-region located on a first side of the display region, the first touch signal lines are connected to the first touch electrode sets through the second ends of the first touch signal lines, and the first-wiring-side bridging section and the second ends of the first touch signal lines are disposed in the first touch signal wiring sub-region.

4. The display module as claimed in claim 1, wherein the plurality of touch signal lines comprise second touch signal lines connected to at least one of the second touch electrode sets, and the at least one backup wiring comprises a second backup wiring; and the second backup wiring comprises a second terminal-side bridging section and a second wiring-side bridging section, an orthogonal projection of first ends of the second touch signal lines on the display panel partially overlaps an orthogonal projection of the second-terminal-side bridging section on the display panel, and an orthogonal projection of second ends of the second touch signal lines on the display panel partially overlaps an orthogonal projection of the second-wiring-side bridging section on the display panel.

5. The display module as claimed in claim 4, wherein the touch wiring region comprises a second touch wiring sub-region located on a second side of the display region, and the second touch wiring sub-region is located between the display region and the hub region, and
the second touch signal lines are connected to the second touch electrode sets through the second ends of the second touch signal lines, and the second-wiring-side bridging section and the second ends of the second touch signal lines are disposed in the second touch wiring sub-region.

6. The display module as claimed in claim 4, wherein the plurality of touch signal lines comprise third touch signal lines connected to at least one of the second touch electrode sets, and the at least one backup wiring comprises a third backup wiring; and
the third backup wiring comprises a third terminal-side bridging section and a third wiring-side bridging section, an orthogonal projection of first ends of the third touch signal lines on the display panel partially overlaps an orthogonal projection of the third-terminal-side bridging section on the display panel, and an orthogonal projection of second ends of the third touch signal lines on the display panel partially overlaps an orthogonal projection of the third-wiring-side bridging section on the display panel.

7. The display module as claimed in claim 6, wherein the touch wiring region comprises a third touch wiring sub-region located on a third side of the display region, the third touch signal lines are connected to the second touch electrode sets through the second ends of the third touch signal lines, and the third-wiring-side bridging section and the second ends of the third touch signal lines are disposed in the third touch wiring sub-region.

8. The display module as claimed in claim 6, wherein the plurality of touch signal lines comprise a plurality of first touch signal lines respectively connected to each of the first touch electrode sets, and the at least one backup wiring comprises a first backup wiring;
the first backup wiring comprises a first-terminal-side bridging section, a first-wiring-side bridging section, and a first main line segment connected to the first-terminal-side bridging section and the first-wiring-side bridging section; and
the second backup wiring further comprises a second main line segment connected to the second-terminal-side bridging section and the second-wiring-side bridging section, the third backup wiring further comprises a third main line segment connected to the third-terminal-side bridging section and the third-wiring-side bridging section, and the second main line segment at least partially overlaps the third main line segment.

9. The display module as claimed in claim 8, wherein an orthogonal projection of the third main line segment on the display panel partially overlaps an orthogonal projection of the third touch signal lines on the display panel.

10. The display module as claimed in claim 1, wherein the touch structure comprises a first insulation layer and a plurality of bridging blocks, the backup wiring set and the bridging blocks are disposed on a side of the first insulation layer, and the first touch electrode sets, the second touch electrode sets, and the touch signal lines are disposed on a side of the first insulation layer away from the backup wiring set; and
the first touch electrode sets comprise at least two first touch electrodes arranged along the second direction and sequentially connected together, the second touch electrode sets comprise at least two second touch electrodes arranged along the first direction and sequentially connected together, two adjacent first touch electrodes are bridged by one of the bridging blocks, and the backup wiring set and the bridging blocks are structures integrated into one piece.

11. A display device, comprising a display panel and a touch structure disposed on a side of the display panel, wherein the display panel comprises a display region and a non-display region arranged around the display region, and the non-display region comprises a touch wiring region located on a peripheral side of the display region and a hub region located on a side of the touch wiring region away from the display region;
wherein the touch structure comprises:
a touch layer, wherein the touch layer comprises a plurality of touch electrode sets located in the display region, the plurality of touch electrode sets comprise at least two first touch electrode sets and at least two second touch electrode sets, each of the first touch electrode sets is arranged along a first direction and is located in the display region, each of the second touch electrode sets is arranged along a second direction and is located in the display region, and the second direction intersects with the first direction and is at a predetermined angle with the first direction;
a plurality of touch signal lines disposed in the non-display region, wherein each of the touch electrode sets is connected to one of the touch signal lines; and
a backup wiring set located in the non-display region and disposed on a different layer from the touch signal lines, wherein the backup wiring set comprises at least one backup wiring, and
wherein the backup wiring comprises a terminal-side bridging section and a wiring-side bridging section, one backup wiring at least corresponds to one of the touch signal lines, an orthogonal projection of first ends of the touch signal lines corresponding to the backup wiring on the display panel partially overlaps an orthogonal projection of the terminal-side bridging section on the display panel, an orthogonal projection of second ends of the touch signal lines corresponding to the backup wiring on the display panel partially overlaps an orthogonal projection of the wiring-side bridging section on the display panel, the terminal-side bridging section and the first ends of the touch signal lines are located in the hub region, and the wiring-side bridging section and the second ends of the touch signal lines are located in the touch wiring region.

12. The display device as claimed in claim 11, wherein the plurality of touch signal lines comprise a plurality of first touch signal lines respectively connected to each of the first touch electrode sets, and the at least one backup wiring comprises a first backup wiring; and
the first backup wiring comprises a first-terminal-side bridging section and a first-wiring-side bridging section, an orthogonal projection of first ends of the first touch signal lines on the display panel partially overlaps an orthogonal projection of the first-terminal-side bridging section on the display panel, and an orthogonal projection of second ends of the first touch signal lines on the display panel partially overlaps an orthogonal projection of the first-wiring-side bridging section on the display panel.

13. The display device as claimed in claim 12, wherein the touch wiring region comprises a first touch wiring sub-region located on a first side of the display region, the first touch signal lines are connected to the first touch electrode sets through the second ends of the first touch signal lines, and the first-wiring-side bridging section and the second ends of the first touch signal lines are disposed in the first touch signal wiring sub-region.

14. The display device as claimed in claim 11, wherein the plurality of touch signal lines comprise second touch signal lines connected to at least one of the second touch electrode sets, and the at least one backup wiring comprises a second backup wiring; and the second backup wiring comprises a second-terminal-side bridging section and a second-wiring-side bridging section, an orthogonal projection of first ends of the second touch signal lines on the display panel partially overlaps an orthogonal projection of the second-terminal-side bridging section on the display panel, and an orthogonal projection of second ends of the second touch signal lines on the display panel partially overlaps an orthogonal projection of the second-wiring-side bridging section on the display panel.

15. The display device as claimed in claim 14, wherein the touch wiring region comprises a second touch wiring sub-region located on a second side of the display region, and the second touch wiring sub-region is located between the display region and the hub region, and the second touch signal lines are connected to the second touch electrode sets through the second ends of the second touch signal lines, and the second-wiring-side bridging section and the second ends of the second touch signal lines are disposed in the second touch wiring sub-region.

16. The display device as claimed in claim 14, wherein the plurality of touch signal lines comprise third touch signal lines connected to at least one of the second touch electrode sets, and the at least one backup wiring comprises a third backup wiring; and the third backup wiring comprises a third-terminal-side bridging section and a third-wiring-side bridging section, an orthogonal projection of first ends of the third touch signal lines on the display panel partially overlaps an orthogonal projection of the third-terminal-side bridging section on the display panel, and an orthogonal projection of second ends of the third touch signal lines on the display panel partially overlaps an orthogonal projection of the third-wiring-side bridging section on the display panel.

17. The display device as claimed in claim 16, wherein the touch wiring region comprises a third touch wiring sub-region located on a third side of the display region, the third touch signal lines are connected to the second touch electrode sets through the second ends of the third touch signal lines, and the third-wiring-side bridging section and the second ends of the third touch signal lines are disposed in the third touch wiring sub-region.

18. The display device as claimed in claim 16, wherein the plurality of touch signal lines comprise a plurality of first touch signal lines respectively connected to each of the first touch electrode sets, and the at least one backup wiring comprises a first backup wiring;

the first backup wiring comprises a first-terminal-side bridging section, a first-wiring-side bridging section, and a first main line segment connected to the first-terminal-side bridging section and the first-wiring-side bridging section; and the second backup wiring further comprises a second main line segment connected to the second-terminal-side bridging section and the second-wiring-side bridging section, the third backup wiring further comprises a third main line segment connected to the third-terminal-side bridging section and the third-wiring-side bridging section, and the second main line segment at least partially overlaps the third main line segment.

* * * * *